(12) United States Patent
Balasubramanian et al.

(10) Patent No.: US 7,745,724 B2
(45) Date of Patent: Jun. 29, 2010

(54) PHOTOVOLTAIC CELLS INTEGRATED WITH BYPASS DIODE

(75) Inventors: Srini Balasubramanian, Westford, MA (US); Howard Berke, Hollis, NH (US); Kevin Coakley, Andover, MA (US); Markus Scharber, Linz (AT)

(73) Assignee: Konarka Technologies, Inc., Lowell, MA (US)

( * ) Notice: Subject to any disclaimer, the term of this patent is extended or adjusted under 35 U.S.C. 154(b) by 536 days.

(21) Appl. No.: 11/515,418

(22) Filed: Sep. 1, 2006

(65) Prior Publication Data

US 2007/0089779 A1    Apr. 26, 2007

Related U.S. Application Data

(60) Provisional application No. 60/713,655, filed on Sep. 1, 2005.

(51) Int. Cl.
*H01L 31/00* (2006.01)
(52) U.S. Cl. .................. 136/263; 136/252; 136/256
(58) Field of Classification Search .................. 136/243, 136/258, 260, 264, 263; 257/292, 293
See application file for complete search history.

(56) References Cited

U.S. PATENT DOCUMENTS

| | | | |
|---|---|---|---|
| 4,323,719 A | | 4/1982 | Green |
| 5,009,720 A | * | 4/1991 | Hokuyo et al. ............... 136/255 |
| 6,103,970 A | * | 8/2000 | Kilmer et al. ................ 136/252 |
| 6,303,943 B1 | | 10/2001 | Yu et al. |
| 6,359,210 B2 | | 3/2002 | Ho et al. |
| 6,680,432 B2 | * | 1/2004 | Sharps et al. ................ 136/255 |
| 6,690,041 B2 | | 2/2004 | Armstrong et al. |
| 2003/0230337 A1 | * | 12/2003 | Gaudiana et al. ............ 136/256 |
| 2004/0089339 A1 | * | 5/2004 | Kukulka et al. .............. 136/251 |

OTHER PUBLICATIONS

Padinger et al. "Effects of Postproduction Treatment on Plastic Solar Cells" Advanced Functional Materials, 2003, 13 No. 2, Feb. 2003, pp. 1-4.*

* cited by examiner

*Primary Examiner*—Jeffrey T Barton
*Assistant Examiner*—Devina Pillay
(74) *Attorney, Agent, or Firm*—Fish & Richardson P.C.

(57) ABSTRACT

Photovoltaic cells integrated with a bypass diode, as well as related systems, components, and methods, are disclosed.

16 Claims, 3 Drawing Sheets

PHOTOVOLTAIC CELLS INTEGRATED WITH BYPASS DIODE

CROSS REFERENCE TO RELATED APPLICATIONS

This application claims priority to U.S. Provisional Application Ser. No. 60/713,655, filed Sep. 1, 2005, the contents of which are hereby incorporated by reference.

TECHNICAL FIELD

This disclosure relates to photovoltaic cells integrated with a bypass diode, as well as related systems, components, and methods.

BACKGROUND

Photovoltaic cells are commonly used to convert energy in the form of light into energy in the form of electricity. A typical photovoltaic cell includes a photoactive material disposed between two electrodes. Generally, light passes through one or both of the electrodes to interact with the photoactive material to convert light energy into electricity energy.

Photovoltaic cells are typically assembled into modules containing an array of photovoltaic cells connected together in series, or in parallel, or in a series-parallel combination. When all cells in a module are illuminated, each cell is forward biased. However, if one or more of the cells is shadowed (i.e., not illuminated), the shadowed cell or cells may become reversed biased because of the voltage generated by the unshadowed cells. Reverse biasing of a cell can cause degradation in cell performance or even complete cell failure.

SUMMARY

In one aspect, the invention features a system containing a photovoltaic cell and a diode. The photovoltaic cell includes a first hole carrier layer, a first hole blocking layer, and a photoactive layer between the first hole carrier layer and the first hole blocking layer. The diode includes a second hole carrier layer and a second hole blocking layer. The first hole carrier layer is electrically connected with the second hole blocking layer. The second hole carrier layer is electrically connected with the first hole blocking layer.

In another aspect, the invention features a system including first and second electrodes, a photoactive layer between the first and second electrodes, and a second layer between the photoactive layer and the first electrode. The photoactive layer includes a first semiconductor material. The second layer includes a second semiconductor material different from the first semiconductor material. The system is configured as a photovoltaic cell.

Embodiments can include one or more of the following aspects.

The diode can be so configured that, when the photovoltaic cell is exposed to light, the diode is not exposed to light.

The photoactive layer can also be between the second hole carrier layer and the second hole blocking layer.

The first hole carrier layer can be electrically connected with the second hole blocking layer via an electrode.

The second hole carrier layer can be electrically connected with the first hole blocking layer via an electrode.

The photoactive layer can include a first semiconductor material and the diode can include a second semiconductor material. In some embodiments, the first semiconductor material is identical to the second semiconductor material.

The first or second semiconductor material can include an electron donor material and an electron acceptor material.

The electron donor material can include a material selected from the group consisting of discotic liquid crystals, polythiophenes, polyphenylenes, polyphenylvinylenes, polysilanes, polythienylvinylenes, and polyisothianaphthalenes. In some embodiments, the electron donor material is poly(3-hexylthiophene).

The electron acceptor material can include a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. In some embodiments, the electron acceptor material is a substituted fullerene.

The first or second hole carrier layer can include a material selected from the group consisting of polythiophenes, polyanilines, polyvinylcarbazoles, polyphenylenes, polyphenylvinylenes, polysilanes, polythienylenevinylenes, polyisothianaphthanenes, and combinations thereof.

The first or second hole blocking layer can include a material selected from the group consisting of LiF, metal oxides and combinations thereof.

The second semiconductor can include fluorine-doped tin oxide or indium tin oxide.

The second layer can have a thickness of at least about 10 nm and at most about 1 micron.

The second layer can be configured to protect the system against reverse biasing.

The first semiconductor material can include a photosensitized interconnected nanoparticle material. In some embodiments, the photosensitized interconnected nanoparticle material can include a material selected from the group consisting of selenides, sulfides, tellurides, titanium oxides, tungsten oxides, zinc oxides, zirconium oxides, and combinations thereof.

The photoactive layer can further include a charge carrier media. In some embodiments, the charge carrier media includes an electrolyte.

The first electrode can include titanium, stainless steel, or tantalum.

The second electrode can include indium tin oxide, tin oxide, or fluorine-doped tin oxide. In some embodiments, the second electrode can include a mesh. In these embodiments, the mesh can include gold, silver, copper, aluminum, nickel, palladium, platinum, titanium, or an alloy thereof.

The system can further include a catalyst layer between the second electrode and the photoactive layer. In some embodiments, the catalyst layer includes platinum.

The photovoltaic cell can be an organic photovoltaic cell or a dye sensitized photovoltaic cell.

Embodiments can provide one or more of the following advantages.

In a module having a plurality of photovoltaic cells, a bypass diode integrated with a photovoltaic cell can allow the current to pass through the diode when the photovoltaic cell is shadowed, thereby preventing a large voltage drop across the shadowed cell and damages to the shadowed cell. As such, the module can continue functioning even if one of the photovoltaic cells is shadowed.

The bypass diode can have relatively high shunt resistance, relatively low series resistance, and relatively high short-circuit current density, open circuit voltage, and fill factor.

The bypass diode can be manufactured in a roll-to-roll process, thereby significantly reducing the manufacturing costs.

Other features, objects, and advantages of the invention will be apparent from the description and drawings, and from the claims.

DESCRIPTION OF DRAWINGS

Like reference symbols in the various drawings indicate like elements.

DETAILED DESCRIPTION

In general, this disclosure relates to photovoltaic cells integrated with a bypass diode.

Figure 1:
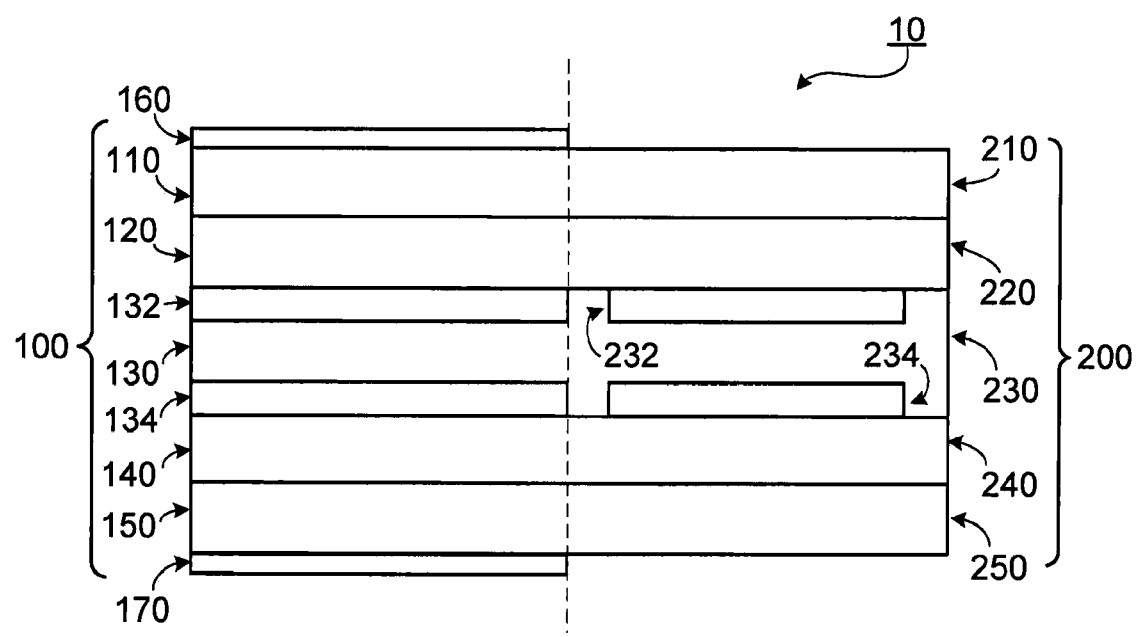
FIG. 1 is a cross-sectional view of a system having a photovoltaic cell integrated with a bypass diode.

FIG. 1 is a schematic illustration of a photovoltaic cell 200 in a system 10 containing a plurality of photovoltaic cells (not shown). Photovoltaic cell 200 is integrated with a diode 100. Diode 100 includes a substrate 110, an electrode 120, a hole carrier layer 132, a photoactive layer 130, a hole blocking layer 134, an electrode 140, a substrate 150, a top cover 160, and a bottom cover 170. Photovoltaic cell 200 includes a substrate 210, an electrode 220, a hole blocking layer 232, a photoactive layer 230, a hole carrier layer 234, an electrode 240, and a substrate 250.

Typically, hole carrier layers 132 and 234 are electrically connected to hole blocking layers 232 and 134, respectively. In some embodiments, electrodes 120 and 220 can be one electrode. In these embodiments, hole carrier layer 132 is electrically connected to hole blocking layer 232 through electrodes 120 and 220. In some embodiments, electrodes 140 and 240 can be one electrode. In these embodiments, hole blocking layer 134 is electrically connected with hole carrier layer 234 through electrodes 140 and 240.

In some embodiments, photoactive layer 230 can contain a first semiconductor material (e.g., a heterojunction composite material including an electron acceptor material and an electron donor material) and photoactive layer 130 can contain a second semiconductor (e.g., a heterojunction composite material including an electron acceptor material and an electron donor material). The first semiconductor material can be identical to or can be different from the second semiconductor material.

Top cover 160 and bottom cover 170 prevent diode 100 from being exposed to light so that diode 100 does not generate current when photovoltaic cell 200 is illuminated with light. When system 10 is illuminated but photovoltaic cell 200 is only partially illuminated or not illuminated, photovoltaic cell 200 generates a reduced amount of current or no current at all. It can become reversed biased because of the voltage generated by other illuminated photovoltaic cells in system 10. Diode 100 allows the current generated by other illuminated cells to pass through, thereby allowing system 10 to continuing function and avoiding damage to photovoltaic cell 200.

In some embodiments, diode 100 can be disposed at the back side of substrate 250 so that diode 100 is not exposed to light. This configuration can preserve the illumination area for the photovoltaic cells in system 10 and maximize the system's efficiency.

In some embodiments, one photovoltaic cell can be integrated with one diode. In certain embodiments, two or more photovoltaic cells can be integrated with one diode. In certain embodiments, one photovoltaic cell can be integrated with two or more diodes.

In some embodiments, diode 100 can be prepared by inkjet printing, gravure printing, vacuum deposition, and/or screen printing. In some embodiments, diode 100 can be manufactured in a roll-to-roll process. In certain embodiments, diode 100 can be manufactured in the same roll-to-roll process used to manufacture photovoltaic cell 200.

Figure 2:
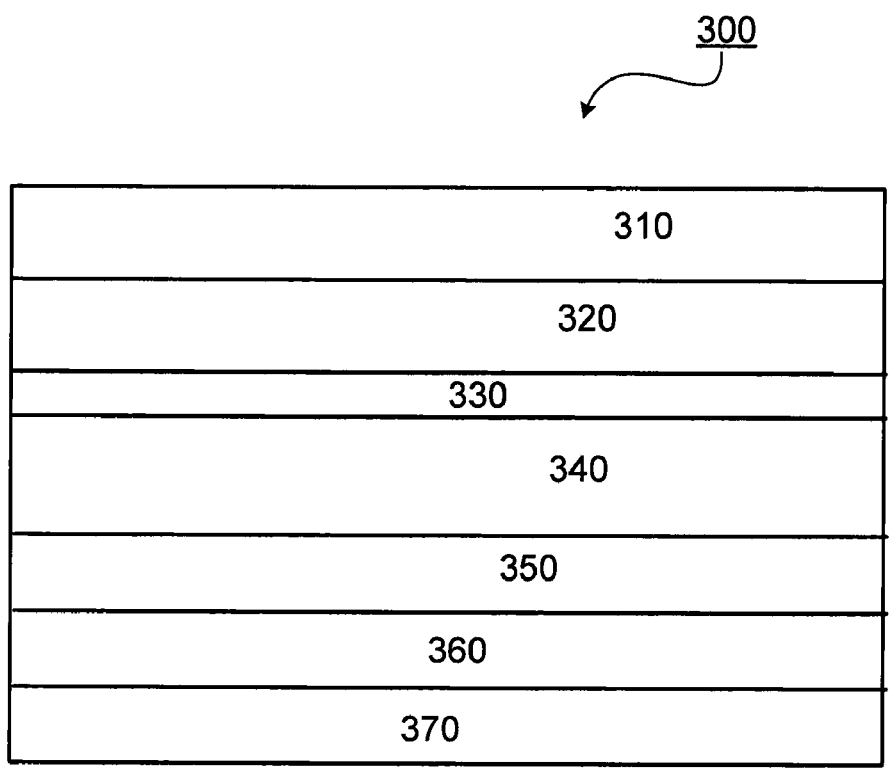
FIG. 2 is a cross-sectional view of a photovoltaic cell containing a layer that protects the photovoltaic cell against reverse biasing.

FIG. 2 is a schematic illustration of a photovoltaic cell 300 in a module containing a plurality of photovoltaic cells (not shown). Photovoltaic cell 300 includes a substrate 310, an electrode 320, a catalyst layer 330, a photoactive layer 340, a diode layer 350, an electrode 360, and a substrate 370.

Typically, photoactive layer 340 includes a first semiconductor material (e.g., a photosensitized nanoparticle material) and a charge carrier media (e.g., an electrolyte). In some embodiments, diode layer 350 includes a second semiconductor material (e.g., fluorine-doped tin oxide) different from the first semiconductor material.

In some embodiments, diode layer 350 can have a thickness of at least about 10 nm (at least about 50 nm, at least about 100 nm, at least 200 nm, at least 300 nm) or at most about 1 micron (at most about 900 nm, at most about 800 nm, at most about 700 nm, at most about 600 nm).

In some embodiments, diode layer 350 can be prepared by inkjet printing, gravure printing, vacuum deposition, and/or screen printing. In some embodiments, diode layer 350 can be manufactured in a roll-to-roll process used to manufacture photovoltaic cell 300.

Without wishing to be bound by theory, it is believed that diode layer 350 can conduct electrons under both forward biasing and reverse biasing conditions. As a result, when photovoltaic cell 200 is only partially illuminated or not illuminated, electrons generated by illuminated photovoltaic cells in the module can still pass through photovoltaic cell 200, thereby protecting photovoltaic cell 200 from damage resulted from reverse biasing.

Referring to FIG. 1, photovoltaic cell 200 is an organic photovoltaic cell. In some embodiments, photoactive layer 230 in photovoltaic cell 200 contains an electron acceptor material and an electron donor material. Electron acceptor materials of photoactive layer 230 can include fullerenes. In some embodiments, photoactive layer 230 can include one or more unsubstituted fullerenes and one or more substituted fullerenes. Examples of unsubstituted fullerenes include $C_{60}$, $C_{70}$, $C_{76}$, $C_{78}$, $C_{82}$, $C_{84}$, and $C_{92}$. Examples of substituted fullerenes include C61-phenyl-butyric acid methyl ester (PCBM) and C61-phenyl-butyric acid glycidol ester (PCBG).

As used herein, the term "fullerene" means a compound, e.g., a molecule, including a three-dimensional carbon skeleton having a plurality of carbon atoms. The carbon skeleton of such fullerenes generally forms a closed shell, which may be, e.g., spherical or semi-spherical in shape. Alternatively, the carbon skeleton may form an incompletely closed shell, such as, e.g., a tubular shape. Carbon atoms of fullerenes are generally linked to three nearest neighbors in a tetrahedral network. The term "fullerene" includes both unsubstituted and substituted fullerenes.

Unsubstituted fullerenes may be designated as $C_j$, where j is an integer related to the number of carbon atoms of the carbon skeleton. For example, $C_{60}$ defines a truncated icosahedron including 32 faces, of which 12 are pentagonal and 20 are hexagonal. Other suitable fullerenes include, e.g., $C_j$ where j may be at least 50 and may be less than about 250. Unsubstituted fullerenes can generally be produced by the high temperature reaction of a carbon source, such as elemental carbon or carbon containing species. For example, sufficiently high temperatures may be created using laser vaporization, an electric arc, or a flame. Subjecting a carbon source to high temperatures forms a carbonaceous deposit from which various unsubstituted fullerenes are obtained. Typically, the unsubstituted fullerenes can be purified using a combination of solvent extraction and chromatography.

Substituted fullerenes include fullerenes containing one or more substituents, such as PCBM and PCBG Examples of suitable substituents include alkyl, alkenyl, alkynyl, cycloalkyl, cycloalkenyl, alkoxy, aryl, aryloxy, heteroaryl, heteroaryloxy, amino, alkylamino, dialkylamino, arylamino, diarylamino, hydroxyl, halogen, thio, alkylthio, arylthio, alkylsulfonyl, arylsulfonyl, cyano, nitro, acyl, acyloxy, carboxyl, and carboxylic ester. These substituents can be further substituted by one or more suitable substituents. Substituted fullerenes can be prepared by any suitable methods. For example, alkylfullerene derivatives can be prepared by reacting fullerenes with organic alkyl lithium or alkyl Grignard reagents and then with alkyl halides. As another example, PCBM can be prepared by reacting $C_{60}$ with methyl 4-benzoylbutyrate p-tosylhydrazone in the presence of a base. PCBM can be further modified to obtain other substituted fullerenes (e.g., PCBG).

Without wishing to be bound by any theory, it is believed that a photovoltaic cell containing a mixture of one or more unsubstituted fullerenes and one or more substituted fullerenes in photoactive layer 230 can exhibit enhanced thermal stability. For example, after being heated at an elevated temperature for a period of time, a photovoltaic cell containing a mixture of one or more unsubstituted fullerenes and one or more substituted fullerenes can undergo a relatively small change in efficiency.

In general, the weight ratio of the unsubstituted fullerene to the substituted fullerene can be varied as desired. In certain embodiments, the weight ratio of the unsubstituted fullerene to the substituted fullerene can be at least about 1:20 (e.g., at least about 1:10, at least about 1:5, at least about 1:3, or at least about 1:1) and/or at most about 10:1 (e.g., at most about 5:1 or at most about 3:1).

In some embodiments, the efficiency of photovoltaic cell 200 after being heated at a temperature of at least about 50° C. (e.g., at least about 100° C., at least about 150° C., at least about 170° C., at least about 200° C., at least about 225° C.) for at least about 5 minutes (e.g., at least about 10 minutes, at least about 15 minutes, at least about 20 minutes, at least about 30 minutes, at least about 60 minutes, at least about 120 minutes) is at least about 50% (e.g., at least about 60%, at least about 70%, at least about 80%, at least about 90%, at least about 95%, at least about 98%) of the efficiency before being heated.

Photovoltaic cell 200 can have an efficiency of at least about 0.5% (e.g., at least about 1%, at least about 2%, at least about 3%, or at least about 4%). The efficiency of a photovoltaic cell refers to the ratio of the solar energy that reaches the cell to the electrical energy that is produced by the cell. Efficiency of a photovoltaic cell can be obtained by methods known in the art. For example, it can be determined from a current-voltage curve derived based on a photovoltaic cell. In some embodiments, the unsubstituted fullerene and the substituted fullerene in photoactive layer 140 can be substantially non-phase separated.

In some embodiments, photoactive layer 230 can include one or more non-fullerene electron acceptor materials. Examples of suitable electron acceptor materials include oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups).

Electron donor materials of photoactive layer 230 can include conducting polymers (e.g., a conjugated organic polymer), which generally have a conjugated layer. Conjugated polymers are characterized in that they have overlapping π orbitals, which contribute to the conductive properties. Conjugated polymers may also be characterized in that they can assume two or more resonance structures. The conjugated organic polymer may be, e.g., linear or branched, so long as the polymer retains its conjugated nature.

Examples of suitable electron donor materials include one or more of polyacetylene, polyaniline, polyphenylene, poly (p-phenylene vinylene), polythienylvinylene, polythiophene, polyporphyrins, porphyrinic macrocycles, polymetallocenes, polyisothianaphthalene, polyphthalocyanine, a discotic liquid crystal polymer, and a derivative or a combination thereof. Exemplary derivatives of the electron donor materials include derivatives having pendant groups, e.g., a cyclic ether, such as epoxy, oxetane, furan, or cyclohexene oxide. Derivatives of these materials may alternatively or additionally include other substituents. For example, thiophene components of electron donor may include a phenyl group, such as at the 3 position of each thiophene moiety. As another example, alkyl, alkoxy, cyano, amino, and/or hydroxy substituent groups may be present in any of the polyphenylacetylene, polydiphenylacetylene, polythiophene, and poly(p-phenylene vinylene) conjugated polymers. In some embodiments, the electron donor material is poly(3-hexylthiophene) (P3HT). In certain embodiments, photoactive layer 230 can include a combination of electron donor materials.

In some embodiments, photoactive layer 230 includes an oriented electron donor material (e.g., a liquid crystal (LC) material), an electroactive polymeric binder carrier (e.g., P3HT), and a plurality of nanocrystals (e.g., oriented nanorods including at least one of ZnO, $WO_3$, or $TiO_2$). The liquid crystal material can be, for example, a discotic nematic LC material, including a plurality of discotic mesogen units. Each unit can include a central group and a plurality of electroactive arms. The central group can include at least one aromatic ring (e.g., an anthracene group). Each electroactive arm can include a plurality of thiophene moieties and a plurality of alkyl moieties. Within the photoactive layer, the units can align in layers and columns. Electroactive arms of units in adjacent columns can interdigitate with one another facilitating electron transfer between units. Also, the electroactive polymeric carrier can be distributed amongst the LC material to further facilitate electron transfer. The surface of each nanocrystal can include a plurality of electroactive surfactant groups to facilitate electron transfer from the LC material and polymeric carrier to the nanocrystals. Each surfactant group can include a plurality of thiophene groups. Each surfactant can be bound to the nanocrystal via, for example, a phosphonic end-group. Each surfactant group also can include a plurality of alkyl moieties to enhance solubility of the nanocrystals in the photoactive layer.

Other electron acceptor materials and electron donor materials are disclosed, for example, in co-pending and commonly owned U.S. Utility application Ser. No. 11/486,536, which is hereby incorporated by reference.

Turning now to other components of photovoltaic cell 200, each of substrates 210 and 250 can generally be formed of a non-transparent material, a semitransparent material or a transparent material. As referred to herein, a transparent material is a material which, at the thickness used in a module, transmits at least about 60% (e.g., at least about 70%, at least about 75%, at least about 80%, at least about 85%) of incident light at a wavelength or a range of wavelengths used during operation. An exemplary wavelength or range of wavelengths occurs between about 300 nanometers and about 850 nanometers. A non-transparent material is a material which, at the thickness used in a module, transmits at most about 20% (e.g., at most about 15%, at most about 10%, at most about 5%, at most about 1%) of incident light at a wavelength of a range of wavelengths used during operation. A semi-transparent material is a material which, at the thickness used in a module, transmits an amount of incident light between that transmitted by a transparent material and that transmitted by a non-transparent material. Exemplary materials from which substrates 210 and 250 can be formed include polyethylene terephthalates, polyimides, polyethylene naphthalates, polymeric hydrocarbons, cellulosic polymers, polycarbonates, polyamides, polyethers and polyether ketones. In certain embodiments, the polymer can be a fluorinated polymer. In some embodiments, combinations of polymeric materials are used. In certain embodiments, different regions of substrate 210 or 250 can be formed of different materials.

In general, substrate 210 or 250 can be flexible, semi-rigid, or rigid (e.g., glass). In some embodiments, substrate 210 or 250 has a flexural modulus of less than about 5,000 megaPascals (e.g., less than about 2,500 megaPascals, less than about 1,000 megaPascals). In certain embodiments, different regions of substrate 210 or 250 can be flexible, semi-rigid, or inflexible (e.g., one or more regions flexible and one or more different regions semi-rigid, one or more regions flexible and one or more different regions inflexible).

Typically, substrate 210 or 250 is at least about one micron (e.g., at least about five microns, at least about 10 microns) thick and/or at most about 5,000 microns (e.g., at most about 1,000 microns, at most about 500 microns thick, at most about 300 microns thick, at most about 200 microns thick, at most about 100 microns, at most about 50 microns) thick.

Generally, substrate 210 or 250 can be colored or non-colored. In some embodiments, one or more layers of substrate 210 or 250 is/are colored while one or more different layers of substrate 210 or 250 is/are non-colored.

Either or both of electrodes 220 and 240 can be configured to transmit at least a layer of light impinging thereon. For example, at least one of electrodes 220 and 240 can be formed of a transparent material. An exemplary transparent material includes a transparent oxide, such as indium tin oxide (ITO). As an alternative to or in conjunction with a transparent material, electrode 220 or 240 can be configured with open areas to allow light to pass through and closed areas defined by a conductive material that conducts electrons. In one embodiment, at least one of electrodes 220 and 240 is a mesh. Mesh electrode can be prepared by an electrically conducting material such as gold, silver, copper, aluminum, nickel, palladium, platinum, titanium, or an alloy thereof. Photovoltaic cells having mesh electrodes are disclosed, for example, in co-pending and commonly owned U.S. Utility application Ser. Nos. 10/395,823, 10/723,554, and 10/494,560, each of which is hereby incorporated by reference.

Hole carrier layer 234 is generally formed of a material that, at the thickness used in photovoltaic cell 200, transports holes to electrode 240 and substantially blocks the transport of electrons to electrode 240. Examples of materials from which hole carrier layer 234 can be formed include polythiophenes (e.g., poly(3,4-ethylenedioxythiophene)), polyanilines, polyvinylcarbazoles, polyphenylenes, polyphenylvinylenes, polysilanes, polythienylenevinylenes and/or polyisothianaphthanenes. In some embodiments, hole carrier layer 234 can include combinations of hole carrier materials.

In general, the distance between the upper surface of hole carrier layer 234 (i.e., the surface of hole carrier layer 234 in contact with photoactive layer 230) and the upper surface of electrode 240 (i.e., the surface of electrode 240 in contact with hole carrier layer 234) can be varied as desired. Typically, the distance between the upper surface of hole carrier layer 234 and the upper surface of electrode 240 is at least 0.01 micron (e.g., at least about 0.05 micron, at least about 0.1 micron, at least about 0.2 micron, at least about 0.3 micron, or at least about 0.5 micron) and/or at most about 5 microns (e.g., at most about 3 microns, at most about 2 microns, or at most about 1 micron). In some embodiments, the distance between the upper surface of hole carrier layer 234 and the upper surface of electrode 240 is from about 0.01 micron to about 0.5 micron.

Generally, photoactive layer 230 is sufficiently thick to be relatively efficient at absorbing photons impinging thereon to form corresponding electrons and holes, and sufficiently thin to be relatively efficient at transporting the holes and electrons to electrodes of the device. In certain embodiments, photoactive layer 230 is at least 0.05 micron (e.g., at least about 0.1 micron, at least about 0.2 micron, or at least about 0.3 micron) thick and/or at most about 1 micron (e.g., at most about 0.5 micron or at most about 0.4 micron) thick. In some embodiments, photoactive layer 230 is from about 0.1 micron to about 0.2 micron thick.

Hole blocking layer 232 is generally formed of a material that, at the thickness used in photovoltaic cell 200, transports electrons to electrode 220 and substantially blocks the transport of holes to electrode 220. Examples of materials from which hole blocking layer 232 can be formed include LiF and metal oxides (e.g., zinc oxide, titanium oxide).

Typically, hole blocking layer 232 is at least 0.02 micron (e.g., at least about 0.03 micron, at least about 0.04 micron, or at least about 0.05 micron) thick and/or at most about 0.5 micron (e.g., at most about 0.4 micron, at most about 0.3 micron, at most about 0.2 micron, or at most about 0.1 micron) thick.

In some embodiments, a photovoltaic cell can be prepared as follows. Electrode 220 is formed on substrate 210 using conventional techniques, and hole-blocking layer 232 is formed on electrode 220 (e.g., using a vacuum deposition process or a solution coating process). Photoactive layer 230 is formed on hole-blocking layer 232 using a suitable process, such as, ink jet printing, spin coating, dip coating, knife coating, bar coating, spray coating, roller coating, slot coating, gravure coating, or screen printing. Hole carrier layer 234 is formed on photoactive layer 230 using, for example, a solution coating process. Electrode 240 is partially disposed in hole carrier layer 234 (e.g., by disposing electrode 240 on the surface of hole carrier layer 234, and pressing electrode 240). Substrate 250 is then formed on electrode 240 *and* hole carrier layer 234 using conventional methods.

Turning to the components in diode 100, substrate 110 can generally be the same as or different from substrate 210 described above, and substrate 150 can generally be the same as or different from substrate 250 described above. In some embodiments, substrates 110 and 150 are identical to substrates 210 and 250, respectively.

Typically, electrode 120 can be the same as or different from electrode 220 described above, and substrate 140 can generally be the same as or different from substrate 240 described above. In some embodiments, electrodes 110 and 150 are identical to electrodes 210 and 250, respectively.

Referring to FIG. 2, photovoltaic cell 300 is a dye sensitized photovoltaic cell. Photoactive layer 340 in photovoltaic cell 300 generally includes a semiconductor material (such as semiconductor nanoparticles photosensitized by a photosensitizing agent) and an electrolyte.

Examples of materials that can be used to prepare the semiconductor material include materials of the formula $M_xO_y$, where M may be, for example, titanium, zinc, zirconium, tungsten, niobium, lanthanum, tantalum, terbium, or tin, and x and y are integers greater than zero. Other suitable materials include sulfides, selenides, tellurides, and oxides (e.g., oxides of titanium, zinc, zirconium, tungsten, niobium, lanthanum, tantalum, terbium, or tin), or combinations thereof. For example, $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulphides, and potassium niobate may be suitable semiconductor materials.

Typically, the semiconductor material contained within photoactive layer 340 is in the form of nanoparticles. In some embodiments, photoactive layer 340 includes nanoparticles with an average size between about 2 nm and about 100 nm (e.g., between about 10 nm and about 40 nm, such as about 20 nm). The nanoparticles can be interconnected, for example, by high temperature sintering, or by a reactive polymeric linking agent, such as poly(n-butyl titanate). A polymeric linking agent can enable the fabrication of an interconnected nanoparticle layer at relatively low temperatures (e.g., less than about 300° C.) and in some embodiments at room temperature. The relatively low temperature interconnection process may be amenable to continuous manufacturing processes using polymer substrates.

In some embodiments, photoactive layer 340 can be formed of a porous material. The porosity of the porous material can be at least about 40% (e.g., at least about 50%, at least about 60%, or at least about 70%) or at most about 95% (e.g., at most about 90% or at most about 80%). The diameter of the pores can be at most about 1,000 nm (e.g., at most about 500 nm or at most about 100 nm) or at least about 1 nm (e.g., at least about 5 nm, at least about 10 nm, or at least about 50 nm). In certain embodiments, the pores are randomly distributed in photoactive layer 340.

In some embodiments, photoactive layer 340 can further include macroparticles of the semiconductor material, where at least some of the semiconductor macroparticles are chemically bonded to each other, and at least some of the semiconductor nanoparticles are bonded to semiconductor macroparticles. Macroparticles refers to a collection of particles having an average particle size of at least about 100 nanometers (e.g., at least about 150 nanometers, at least about 200 nanometers, at least about 250 nanometers). Examples of photovoltaic cells including macroparticles in the photoactive layer are disclosed, for example, in co-pending and commonly owned U.S. Utility application Ser. No. 11/179,976, which is hereby incorporated by reference.

In general, the semiconductor material in photoactive layer 340 is photosensitized with a photosensitizing agent. The photosensitizing agent may include, for example, one or more dyes containing functional groups, such as carboxyl and/or hydroxyl groups, that can chelate to the semiconductor material, e.g., to Ti(IV) sites on a $TiO_2$ surface. Exemplary dyes include anthocyanines, porphyrins, phthalocyanines, merocyanines, cyanines, squarates, eosins, and metal-containing dyes such as cis-bis(isothiocyanato)bis(2,2'-bipyridyl-4,4'-dicarboxylato)-ruthenium (II), tris(isothiocyanato)-ruthenium (II)-2,2':6',2"-terpyridene-4,4',4"-tricarboxylic acid, cis-bis(isothiocyanato)bis(2,2'-bipyridyl-4,4'-dicarboxylato) ruthenium (II) bis-tetrabutylammonium, cis-bis(isocyanato) (2,2'-bipyridyl-4,4' dicarboxylato) ruthenium (II), and tris(2, 2'-bipyridyl-4,4'-dicarboxylato) ruthenium (II) dichloride, all of which are available from Solaronix.

In embodiments where the semiconductor material is in the form of interconnected nanoparticles, the interconnected nanoparticles can also be photosensitized by the photosensitizing agent. The photosensitizing agent facilitates conversion of incident light into electricity to produce the desired photovoltaic effect. It is believed that the photosensitizing agent absorbs incident light resulting in the excitation of electrons in the photosensitizing agent. The energy of the excited electrons is then transferred from the excitation levels of the photosensitizing agent into a conduction band of the interconnected nanoparticles. This electron transfer results in an effective separation of charge and the desired photovoltaic effect. Accordingly, the electrons in the conduction band of the interconnected nanoparticles are made available to drive an external load.

The photosensitizing agent can be sorbed (e.g., chemisorbed and/or physisorbed) on the nanoparticles. The photosensitizing agent is selected, for example, based on its ability to absorb photons in a wavelength range of operation (e.g., within the visible spectrum), its ability to produce free electrons (or electron holes) in a conduction band of the nanoparticles, and its effectiveness in complexing with or sorbing to the nanoparticles, and/or its color.

The electrolyte in photoactive layer 340 includes a material that facilitates the transfer of electrical charge from a ground potential or a current source to the photosensitizing agent. A general class of suitable electrolytes include solvent-based liquid electrolytes, polyelectrolytes, polymeric electrolytes, solid electrolytes, n-type and p-type transporting materials (e.g., conducting polymers), and gel electrolytes. Other choices for electrolytes are possible. For example, the electrolytes can include a lithium salt that has the formula LiX, where X is an iodide, bromide, chloride, perchlorate, thiocyanate, trifluoromethyl sulfonate, or hexafluorophosphate.

In some embodiments, the electrolyte can include a redox system. Suitable redox systems may include organic and/or inorganic redox systems. Examples of such systems include cerium(III) sulphate/cerium(IV), sodium bromide/bromine, lithium iodide/iodine, $Fe^{2+}/Fe^{3+}$, $Co^{2+}/Co^{3+}$, and viologens. Furthermore, the electrolyte may have the formula $M_iX_j$, where i and j are greater than or equal to one, where X is an anion, and M is lithium, copper, barium, zinc, nickel, a lanthanide, cobalt, calcium, aluminum, or magnesium. Suitable anions include chloride, perchlorate, thiocyanate, trifluoromethyl sulfonate, and hexafluorophosphate.

In some embodiments, the electrolyte includes a polymeric electrolyte. For example, the polymeric electrolyte can include poly(vinyl imidazolium halide) and lithium iodide and/or polyvinyl pyridinium salts. In certain embodiments, the electrolyte can include a solid electrolyte, such as lithium iodide, pyridimum iodide, and/or substituted imidazolium iodide.

In some embodiments, the electrolyte can include various types of polyelectrolytes. For example, suitable polyelectrolytes can include between about 5% and about 95% (e.g., 5-60%, 5-40%, or 5-20%) by weight of a polymer, e.g., an ion-conducting polymer, and about 5% to about 95% (e.g., about 35-95%, 60-95%, or 80-95%) by weight of a plasticizer, about 0.05 M to about 10 M of a redox electrolyte of organic or inorganic iodides (e.g., about 0.05-2 M, 0.05-1 M, or 0.05-0.5 M), and about 0.01 M to about 1 M (e.g., about 0.05-0.5 M, 0.05-0.2 M, or 0.05-0.1 M) of iodine. The ion-conducting polymer may include, for example, polyethylene oxide, polyacrylonitrile, polymethylmethacrylate, polyethers, and polyphenols. Examples of suitable plasticizers include ethyl carbonate, propylene carbonate, mixtures of carbonates, organic phosphates, butyrolactone, and dialkylphthalates.

In some embodiments, the electrolyte can include one or more zwitterionic compounds. In general, the zwitterionic compound(s) have the formula:

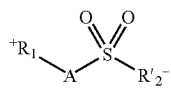

where $R_1$ is a cationic heterocyclic moiety, a cationic ammonium moiety, a cationic guanidinium moiety, or a cationic phosphonium moiety. $R_1$ can be unsubstituted or substituted (e.g., alkyl substituted, alkoxy substituted, poly(ethyleneoxy) substituted, nitrogen-substituted). Examples of cationic substituted heterocyclic moieties include cationic nitrogen-substituted heterocyclic moieties (e.g., alkyl imidazolium, piperidinium, pyridinium, morpholinium, pyrimidinium, pyridazinium, pyrazinium, pyrazolium, pyrrolinium, thiazolium, oxazolium, triazolium). Examples of cationic substituted ammonium moieties include cationic alkyl substituted ammonium moieties (e.g., symmetric tetraalkylammonium). Examples of cationic substituted guanidinium moieties include cationic alkyl substituted guanidinium moieties (e.g., pentalkyl guanidinium. $R_2$ is an anoinic moiety that can be:

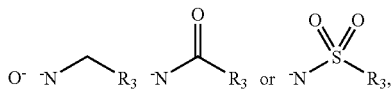

where $R_3$ is H or a carbon-containing moiety selected from $C_x$ alkyl, $C_{x+1}$ alkenyl, $C_{x+1}$ alkynyl, cycloalkyl, heterocyclyl and aryl; and x is at least 1 (e.g., two, three, four, five, six, seven, eight, nine, 10, 11, 12, 13, 14, 15, 16, 17, 18, 19, 20). In some embodiments, a carbon-containing moiety can be substituted (e.g., halo substituted). A is $(C(R_3)_2)_n$, where: n is zero or greater (e.g., one, two, three, four, five, six, seven, eight, nine, 10, 11, 12, 13, 14, 15, 16, 17, 18, 19, 20); and each $R_3$ is independently as described above. Electrolytes including one or more zwitterionic compounds are disclosed, for example, in co-pending and commonly owned U.S. Utility application Ser. No. 11/000,276, which is hereby incorporated by reference.

Although the semiconductor material, the photosensitizing agent, and the electrolyte are interspersed in one layer in the foregoing embodiments, in some embodiments these materials may be disposed in different layers.

Catalyst layer 330 is generally formed of a material that can catalyze a redox reaction in the photoactive layer 340. Examples of materials from which catalyst layer 330 can be formed include platinum and polymers, such as polythiophenes, polypyrroles, polyanilines and their derivatives. Examples of polythiophene derivatives include poly(3,4-ethylenedioxythiophene), poly(3-butylthiophene), poly[3-(4-octylphenyl)thiophene], poly(thieno[3,4-b]thiophene), and poly(thieno[3,4-b]thiophene-co-3,4-ethylenedioxythiophene). Catalyst layers containing one or more polymers are disclosed, for example, in co-pending and commonly owned U.S. Utility application Ser. Nos. 10/897,268 and 11/302,634, both of which are hereby incorporated by reference.

In embodiments where catalyst layer 330 contains platinum, the platinum can be applied onto electrode 320 by, for example, screen printing. In embodiments where catalyst layer 330 contains a polymer, the polymer can be electrochemically deposited on electrode 320. Methods of electrochemical deposition are described in, for example, "Fundamentals of Electrochemical Deposition," by Milan Paunovic and Mordechay Schlesinger (Wiley-Interscience; November 1998), which is incorporated herein by reference. The polymer can also be coated on electrode 320 by using a suitable coating method, such as spin coating, dip coating, knife coating, bar coating, spray coating, roller coating, slot coating, gravure coating, screen printing, and/or ink-jetting.

In general, substrates 310 and 370 can be prepared from a suitable material used to prepare the substrates described above. Electrodes 320 and 360 can generally be prepared from a suitable material used to prepare the electrodes described above.

Other examples of DSSCs are discussed in U.S. patent application Ser. No. 11/311,805 filed Dec. 19, 2005 and Ser. No. 11/269,956 filed on Nov. 9, 2005, the contents of which are hereby incorporated by reference.

Figure 3:
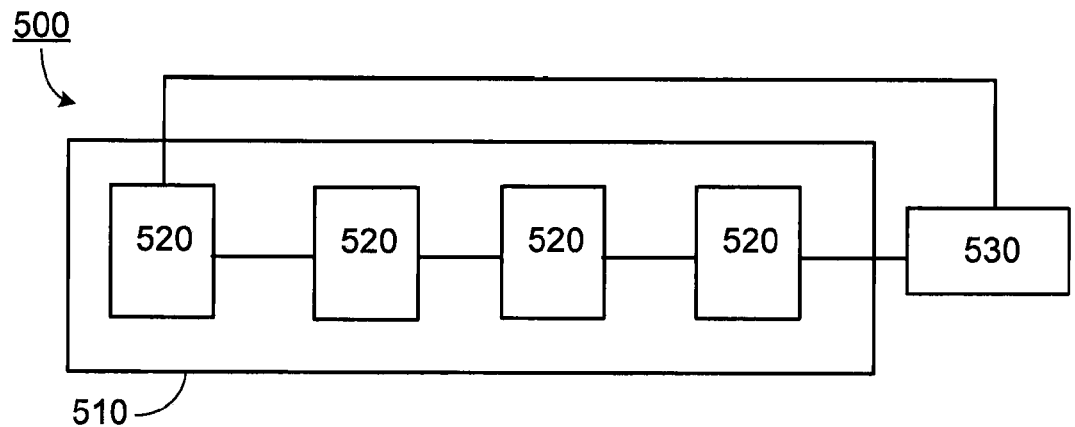
FIG. 3 is a schematic of a system containing multiple photovoltaic cells electrically connected in series.
Figure 4:
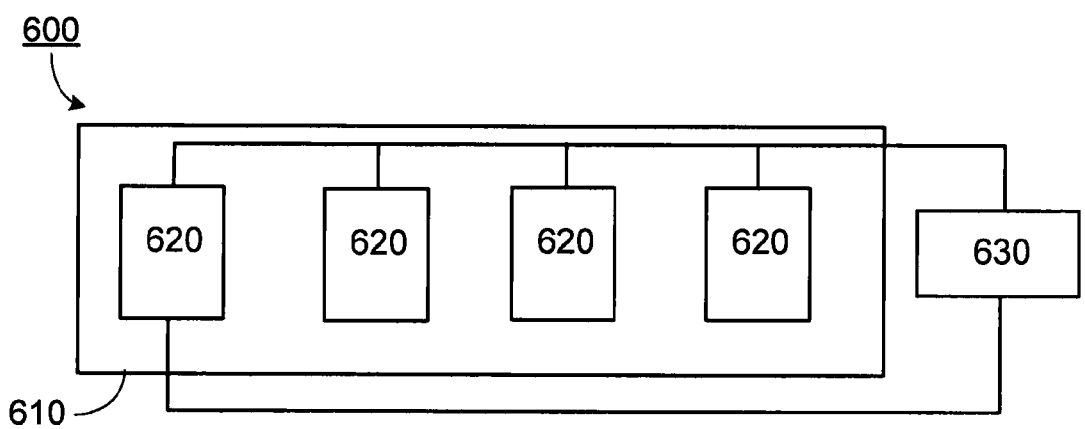
FIG. 4 is a schematic of a system containing multiple photovoltaic cells electrically connected in parallel.

A photovoltaic module containing one or more photovoltaic cells described above can include a plurality of photovoltaic cells, at least some of which are electrically connected. As an example, FIG. 3 is a schematic of a photovoltaic system 500 having a module 510 containing photovoltaic cells 520. Cells 520 are electrically connected in series, and system 500 is electrically connected to a load 530. As another example, FIG. 4 is a schematic of a photovoltaic system 600 having a module 610 that contains photovoltaic cells 620. Cells 620 are electrically connected in parallel, and system 600 is electrically connected to a load 630. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

While organic photovoltaic cells and dye sensitized photovoltaic cells having been described, other photovoltaic cells can also be integrated with a bypass diode to protect the cell from reverse biasing. Examples of such photovoltaic cells include photoactive cells with an photoactive material formed of amorphous silicon, cadmium selenide, cadmium telluride, copper indium sulfide, and copper indium gallium selenide. In some embodiments, a hybrid photoltaic cell can be integrated with a bypass diode.

The following examples are illustrative and not intended to be limiting.

EXAMPLE

A photovoltaic cell based on FIG. 2 was prepared as follows: A Ti foil was purchased from Hamilton Precision Metals (Lancaster, Pa.) and was placed on a hot plate. A solution containing $TiCl_4$ (7.8 g) and $NH_4Cl$ (0.25 g) in water (100 g) was sprayed on the Ti foil. After the water evaporated, a coating of fluorinated tin oxide (FTO) was formed on the Ti foil. A paste of TiO$_2$ nanoparticles was then applied onto the FTO coating and sintered at about 480° C. to form a TiO$_2$ nanoparticle layer. A dye was subsequently absorbed onto the TiO$_2$ nanoparticle layer. A ceiling material was then applied to the edge of the device. A platinized counter electrode (including an ITO layer on polyethylene naphthalate) was laminated onto the TiO$_2$ nanoparticle layer. Finally, an electrolyte containing a mixture of I$_2$/I$_3^-$ was infused in the TiO$_2$ nanoparticle layer to form a photovoltaic cell. A photovoltaic cell without a FTO layer was used as a control.

A reverse voltage (ranging from 0 to −1 V) was applied to both the photovoltaic cells with a FTO layer and without a FTO for 1 hour. The results were summarized in Table 1 below. The results show that the efficiency of the photovoltaic cell with a FTO layer was maintained after 1 hour of reverse biasing, while the efficiency of the photovoltaic cell without a FTO layer was significant reduced after 1 hour reverse biasing. Further, the results show that there was current passing through the photovoltaic cell with a FTO layer under the reverse voltage.

TABLE 1

Shade Test Results

| | | time zero data | | | | after 1 hour reverse bias | | | |
|---|---|---|---|---|---|---|---|---|---|
| device ID | area | Voc | Jsc | efficiency | fill factor | Voc | Jsc | efficiency | fill factor |
| FTO coated Ti foil | | | | | | | | | |
| A1 time zero | 3.39 | 0.66 | 6.884 | 2.54 | 55.8 | 0.675 | 6.903 | 2.64 | 56.7 |
| A2 time zero | 3.2 | 0.672 | 6.953 | 2.63 | 56.3 | 0.675 | 7.026 | 2.63 | 55.4 |
| A3 time zero | 3.31 | 0.666 | 7.323 | 2.78 | 57 | 0.676 | 7.316 | 2.74 | 55.4 |
| A4 time zero | 3.26 | 0.658 | 7.239 | 2.74 | 57.6 | 0.688 | 7.097 | 2.73 | 55.8 |
| averages | 3.29 | 0.664 | 7.09975 | 2.6725 | 56.675 | 0.6785 | 7.0855 | 2.685 | 55.825 |
| standard deviation | 0.080416 | 0.006325 | 0.213943 | 0.108743 | 0.788987 | 0.006351 | 0.17331 | 0.058023 | 0.613052 |
| Ti foil control - no FTO | | | | | | | | | |
| D1 time zero | 3.42 | 0.713 | 7.117 | 2.88 | 56.8 | 0.717 | 1.504 | 0.61 | 56.9 |
| D2 time zero | 4.4 | 0.702 | 6.708 | 2.68 | 57 | 0.722 | 4.321 | 1.83 | 58.8 |
| D3 time zero | 3.3 | 0.702 | 7.284 | 2.92 | 57.1 | 0.72 | 3.819 | 1.47 | 53.6 |
| D4 time zero | 4.35 | 0.703 | 7.115 | 2.56 | 51.2 | 0.698 | 8.218 | 2.49 | 43.4 |
| averages | 3.8675 | 0.705 | 7.056 | 2.76 | 55.525 | 0.71425 | 4.4655 | 1.6 | 53.175 |
| standard deviation | 0.588409 | 0.005354 | 0.245146 | 0.169706 | 2.88603 | 0.011026 | 2.786311 | 0.783582 | 6.861669 |

* reverse bias means 10 mA/cm$^2$ or −4 V, whichever comes first

Other embodiments are in the claims.

What is claimed is:

1. A system, comprising:
    a photovoltaic cell comprising first and second electrodes, a first hole carrier layer, a first hole blocking layer, and a photoactive layer between the first hole carrier layer and the first hole blocking layer the photoactive layer comprising an organic material; and
    a diode comprising third and fourth electrodes, a second hole carrier layer and a second hole blocking layer;
    wherein the photoactive layer is also between the second hole carrier layer and the second hole blocking layer, the photoactive layer comprises a semiconductor material, the first hole carrier layer is electrically connected with the second hole blocking layer, and the second hole carrier layer is electrically connected with the first hole blocking layer.

2. The system of claim 1, wherein the diode is so configured that, when the photovoltaic cell is exposed to light, the diode is not exposed to light.

3. The system of claim 1, wherein the first hole carrier layer is electrically connected with the second hole blocking layer via an electrode.

4. The system of claim 1, wherein the second hole carrier layer is electrically connected with the first hole blocking layer via an electrode.

5. The system of claim 1, wherein the semiconductor material comprises an electron donor material and an electron acceptor material.

6. The system of claim 5, wherein the electron donor material comprises a material selected from the group consisting of discotic liquid crystals, polythiophenes, polyphenylenes, polyphenylvinylenes, polysilanes, polythienylvinylenes, and polyisothianaphthalenes.

7. The system of claim 6, wherein the electron donor material comprises poly(3-hexylthiophene).

8. The system of claim 5, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing CF$_3$ groups, and combinations thereof.

9. The system of claim 8, wherein the electron acceptor material comprises a substituted fullerene.

10. The system of claim 1, wherein the first or second hole carrier layer comprises a material selected from the group consisting of polythiophenes, polyanilines, polyvinylcarbazoles, polyphenylenes, polyphenylvinylenes, polysilanes, polythienylenevinylenes, polyisothianaphthanenes, and combinations thereof.

11. The system of claim 1, wherein the first or second hole blocking layer comprises a material selected from the group consisting of LiF, metal oxides and combinations thereof.

12. The system of claim 1, wherein the photovoltaic cell is an organic photovoltaic cell.

13. The system of claim 1, wherein the first hole carrier layer is in contact with the first electrode, the first hole blocking layer is in contact with the second electrode, the second hole carrier layer is in contact with the third electrode, the second hole blocking layer is in contact with the fourth electrode, the first electrode is electrically connected with the fourth electrode, and the second electrode is electrically connected with the third electrode.

14. The system of claim 13, wherein the first and fourth electrodes are one electrode.

15. The system of claim 13, wherein the second and third electrodes are one electrode.

16. A system, comprising:
- a photovoltaic cell comprising a first hole carrier layer, a first hole blocking layer, and a photoactive layer between the first hole carrier layer and the first hole blocking layer, the photoactive layer comprising an organic material; and
- a diode comprising a second hole carrier layer and a second hole blocking layer;

wherein the photoactive layer is also between the second hole carrier layer and the second hole blocking layer, the photoactive layer comprises a semiconductor material, the first hole carrier layer is electrically connected with the second hole blocking layer via a first common electrode, and the second hole carrier layer is electrically connected with the first hole blocking layer via a second common electrode.

* * * * *

UNITED STATES PATENT AND TRADEMARK OFFICE
CERTIFICATE OF CORRECTION

PATENT NO. : 7,745,724 B2  Page 1 of 1
APPLICATION NO. : 11/515418
DATED : June 29, 2010
INVENTOR(S) : Srini Balasubramanian It is certified that error appears in the above-identified patent and that said Letters Patent is hereby corrected as shown below:

Column 2, Line 8 (approx.)
Delete "polythienylvinylenes," insert -- polythienylenevinylenes, --

Column 2, Lines 21-22 (approx.)
Delete "polyisothianaphthanenes," insert -- polyisothianaphthalenes, --

Column 6, Line 25 (approx.)
Delete "polythienylvinylene," insert -- polythienylenevinylene, --

Column 8, Line 9 (approx.)
Delete "polyisothianaphthanenes." insert -- polyisothianaphthalenes. --

Column 14, Line 13 (approx.), Claim 6
Delete "polythienylvinylenes," insert -- polythienylenevinylenes, --

Column 14, Line 55 (approx.), Claim 10
Delete "polyisothianaphthanenes," insert -- polyisothianaphthalenes, --

Signed and Sealed this

Nineteenth Day of October, 2010

David J. Kappos
*Director of the United States Patent and Trademark Office*